(12) United States Patent
Makino et al.

(10) Patent No.: US 11,385,303 B2
(45) Date of Patent: Jul. 12, 2022

(54) MAGNETIC SENSOR DEVICE

(71) Applicant: TDK CORPORATION, Tokyo (JP)

(72) Inventors: Kenzo Makino, Tokyo (JP); Takafumi Kobayashi, Tokyo (JP); Hiroshi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/167,581

(22) Filed: Feb. 4, 2021

(65) Prior Publication Data

US 2021/0293902 A1 Sep. 23, 2021

(30) Foreign Application Priority Data

Mar. 19, 2020 (JP) .............................. JP2020-049206

(51) Int. Cl.
*G01R 33/09* (2006.01)
*G01R 33/025* (2006.01)

(52) U.S. Cl.
CPC ........... *G01R 33/025* (2013.01); *G01R 33/09* (2013.01)

(58) Field of Classification Search
CPC .............. G01R 33/0017; G01R 33/093; G01R 33/096; G01R 33/025; G01R 33/09
See application file for complete search history.

(56) References Cited

U.S. PATENT DOCUMENTS

| 5,952,825 | A | 9/1999 | Wan |
| 2013/0320972 | A1 | 12/2013 | Loreit et al. |
| 2014/0300348 | A1 | 10/2014 | Deak et al. |

FOREIGN PATENT DOCUMENTS

EP 3130929 A1 2/2017

*Primary Examiner* — Alesa Allgood
(74) *Attorney, Agent, or Firm* — Oliff PLC

(57) ABSTRACT

A magnetic sensor device includes a conductor that constitutes a coil, and a detection circuit including a plurality of MR elements. The coil includes an upper coil portion. The upper coil portion includes a first conductor portion and a second conductor portion. An average cross-sectional area of the upper coil portion in the first conductor portion of the upper coil portion is smaller than that of the upper coil portion in the second conductor portion. The first conductor portion is located at a position where a first partial magnetic field occurring from the first conductor portion is applied to an MR element.

8 Claims, 9 Drawing Sheets

MAGNETIC SENSOR DEVICE

BACKGROUND OF THE INVENTION

1. Field of the Invention

The present invention relates to a magnetic sensor device including a magnetic detection element and a conductor that generates a magnetic field.

2. Description of the Related Art

Magnetic sensor devices in which a magnetic detection element and a coil for generating a magnetic field are integrated have recently been used for various applications. The coil is used for such purposes as cancelling out another magnetic field applied to the magnetic detection element, setting the magnetic detection element to a desired state, and resetting the magnetic detection element.

EP 3130929 A1 describes a current detection device using a magnetic sensor device in which a magnetic detection element and a coil are integrated. The current detection device according to EP 3130929 A1 is a so-called magnetic balance type current sensor. In the magnetic balance type current sensor, the coil of the magnetic sensor device is used as a feedback coil. The feedback coil generates a second magnetic field that cancels out a first magnetic field generated by a current to be detected flowing through a conductor. The magnetic detection element detects a composite magnetic field of the first magnetic field and the second magnetic field. A feedback coil current depending on a detection value of the magnetic detection element flows through the feedback coil so that the composite magnetic field approaches zero. The magnetic balance type current sensor is configured to be able to detect a detection value of the feedback coil current (hereinafter, also referred to as a current detection value). The current detection value is proportional to the value of the current to be detected. The current detection value therefore corresponds to the detection value of the current to be detected.

In EP 3130929 A1, the feedback coil is described to include an element facing portion opposed to the magnetic detection element and a portion other than the element facing portion. In addition, the width dimension of a coil line in the element facing portion is described to be reduced compared to that of the coil line in the portion other than the element facing portion.

U.S. Pat. No. 5,952,825 A describes a coil (conductor) that generates a magnetic field at a position of a magnetoresistive element for the purpose of cancelling or balancing out an external magnetic field, and a coil (conductor) that sets or resets magnetic domains of the magnetoresistive element. According to U.S. Pat. No. 5,952,825 A, the coils have a relatively large width in portions facing the magnetoresistive element and a relatively small width in portions not facing the magnetoresistive element.

US 2013/0320972 A1 describes a coil (flip conductor) that applies a flip magnetic field for flipping the internal magnetization of a magnetic field sensing element. US 2013/0320972 A1 also describes arranging flip conductor stripes having a relatively small width at the end parts of magnetic field sensing elements and a relatively large width at the center portions of the magnetic field sensing elements.

US 2014/0300348 A1 describes a coil that generates a magnetic field for initializing a magnetoresistive sensor element and a magnetic field for calibrating the magnetoresistive sensor element. According to US 2014/0300348 A1, a width of the coil in a portion facing magnetoresistive sensor elements is greater than or equal to that in a portion not facing the magnetoresistive sensor elements.

Suppose that a coil is used for the purpose of cancelling another magnetic field to be applied to a magnetic detection element. In such a case, depending on the strength of another magnetic field, another magnetic field can fail to be fully cancelled out unless the magnetic field generated by the coil has sufficient strength. To increase the strength of the magnetic field capable of cancellation, the current density in the coil needs to be increased. Similarly, if a coil is used for the purpose of setting a magnetic detection element to a desired state or resetting the magnetic detection element, the current density in the coil needs to be increased to apply a magnetic field of sufficient strength to the magnetic detection element.

The current density can be increased, for example, by reducing the width of the conductor constituting the coil. However, reducing the width of the conductor of the entire coil increases the resistance of the coil, whereby power consumption and the amount of heat generation are increased.

As described above, EP 3130929 A1 describes making the width dimension of the coil line in the element facing portion smaller than that of the coil line in the portion other than the element facing portion. However, the feedback coil described in EP 3130929 A1 is not capable of a sufficient reduction in resistance, since the proportion of the element facing portion to the entire feedback coil is relatively high.

SUMMARY OF THE INVENTION

An object of the present invention is to provide a magnetic sensor device including a magnetic detection element and a conductor that generates a magnetic field, wherein the resistance of the conductor can be reduced while increasing the strength of the magnetic field applied to the magnetic detection element.

A magnetic sensor device according to the present invention includes a magnetic detection element that detects an external magnetic field, and a conductor through which a current flows. The conductor includes a first conductor portion and a second conductor portion that extend continuously when viewed in one direction. A cross-sectional area of the conductor perpendicular to a direction in which the current flows changes from the first conductor portion to the second conductor portion. An average cross-sectional area of the conductor in the first conductor portion is smaller than that of the conductor in the second conductor portion. The first conductor portion is located at a position where a first partial magnetic field occurring from the first conductor portion due to the current is applied to the magnetic detection element. The second conductor portion is located at a position where a second partial magnetic field occurring from the second conductor portion due to the current is not applied to the magnetic detection element, or a position where the second partial magnetic field applied to the magnetic detection element has strength lower than that of the first partial magnetic field applied to the magnetic detection element.

In the magnetic sensor device according to the present invention, the conductor may further include a third conductor portion located on a side opposite to the second conductor portion with respect to the first conductor portion. The first to third conductor portions may extend continuously when viewed in one direction. The cross-sectional area of the conductor perpendicular to the direction in which the current flows may change from the first conductor portion to the third conductor portion. The average cross-sectional area of the conductor in the third conductor portion may be greater than that of the conductor in the first conductor portion. The third conductor portion is located at a position where a third partial magnetic field occurring from the third conductor portion due to the current is not applied to the magnetic detection element, or a position where the third partial magnetic field applied to the magnetic detection element has strength lower than that of the first partial magnetic field applied to the magnetic detection element.

The magnetic sensor device according to the present invention may be used as a current sensor that detects a current to be detected. In such a case, the conductor may constitute a coil for generating a second magnetic field that cancels out a first magnetic field generated by the current to be detected. The magnetic detection element detects a composite magnetic field of the first magnetic field and the second magnetic field. The magnetic detection element may be a magnetoresistive element.

In the magnetic sensor device according to the present invention, the magnetic detection element may be a magnetoresistive element. The magnetoresistive element includes a magnetization pinned layer having a first magnetization whose direction is fixed, and a free layer having a second magnetization whose direction is variable depending on the external magnetic field. The conductor may constitute a coil for generating a magnetic field that sets the direction of the second magnetization of the free layer to a predetermined direction. In such a case, the magnetic sensor device may further include a support member that supports the magnetic detection element. The support member includes a top surface opposed to the magnetic detection element and a bottom surface located opposite to the top surface. The top surface of the support member may include an inclined portion inclined relative to the bottom surface. The magnetic detection element, at least a part of the first conductor portion, and at least a part of the second conductor portion may be located on the inclined portion. A thickness of the conductor in a direction perpendicular to the bottom surface of the support member may change from the first conductor portion to the second conductor portion. An average thickness of the conductor in the first conductor portion may be smaller than that of the conductor in the second conductor portion.

The magnetic sensor device according to the present invention includes the conductor through which the current flows. The conductor includes the first conductor portion and the second conductor portion. In the present invention, the average cross-sectional area of the conductor in the first conductor portion is smaller than that of the conductor in the second conductor portion. Moreover, in the present invention, the first conductor portion is located at a position where the first partial magnetic field occurring from the first conductor portion is applied to the magnetic detection element. The second conductor portion is located at a position where the second partial magnetic field occurring from the second conductor portion is not applied to the magnetic detection element, or a position where the second partial magnetic field applied to the magnetic detection element has strength lower than that of the first partial magnetic field applied to the magnetic detection element. According to the present invention, the resistance of the conductor can thus be reduced while increasing the strength of the magnetic field applied to the magnetic detection element.

Other and further objects, features and advantages of the present invention will appear more fully from the following description.

DETAILED DESCRIPTION OF THE PREFERRED EMBODIMENTS

First Embodiment

Figure 1:
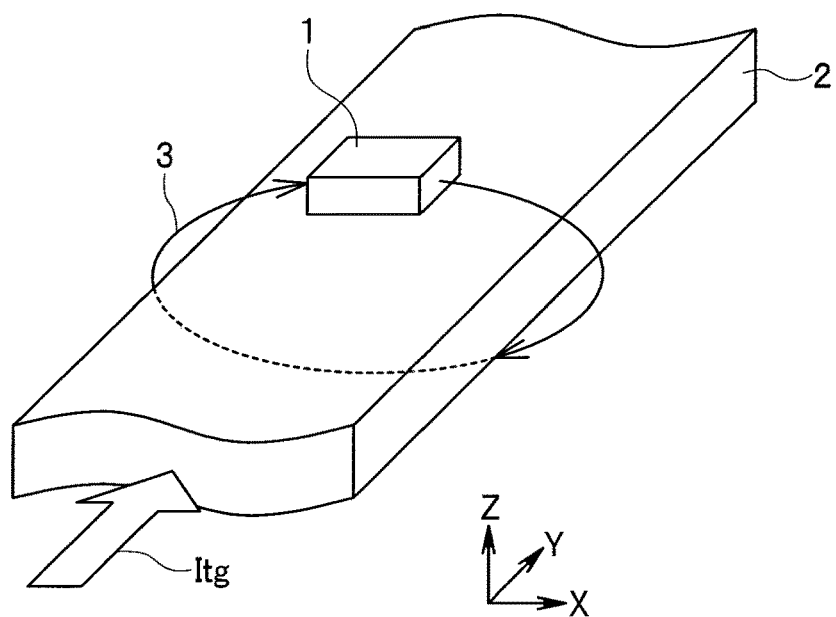
FIG. 1 is a perspective view showing a configuration of a current sensor system of a first embodiment of the present invention.

Preferred embodiments of the present invention will now be described in detail with reference to the drawings. First, reference is made to FIG. 1 to describe a configuration of a current sensor system including a magnetic sensor device according to a first embodiment of the invention. A magnetic sensor device 1 according to the present embodiment is used as a current sensor for detecting the value of a current to be detected flowing through a conductor. FIG. 1 shows an example in which the conductor through which the current to be detected flows is a bus bar 2. The magnetic sensor device 1 is disposed near the bus bar 2. Hereinafter, the current to be detected will be referred to as target current Itg. The target current Itg generates a magnetic field 3 around the bus bar 2. The magnetic sensor device 1 is disposed at a position where the magnetic field 3 is applied.

The magnetic sensor device 1 includes a magnetic detection element that detects an external magnetic field, and a conductor through which a current flows. In particular, in the present embodiment, the magnetic sensor device 1 includes a plurality of magnetic detection elements. The conductor constitutes a coil to be described later.

Figure 2:
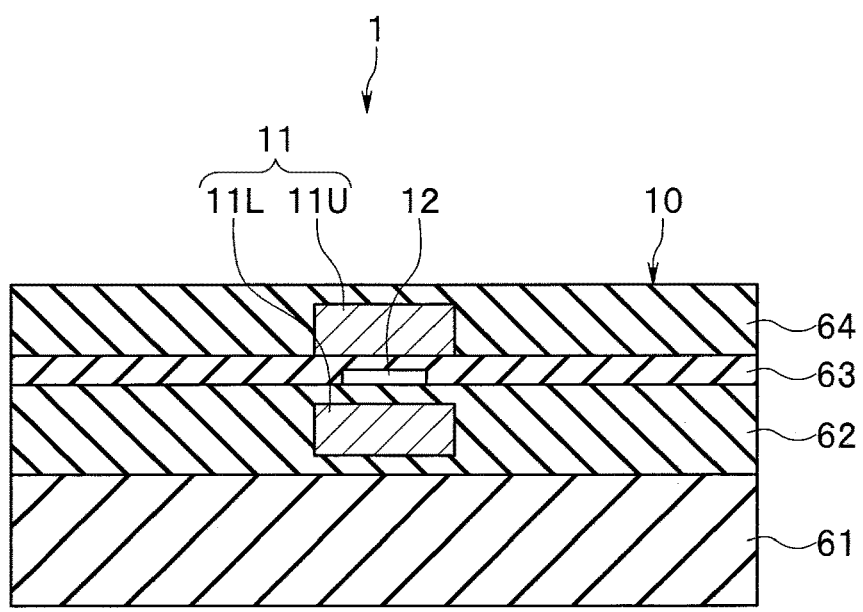
FIG. 2 is a cross-sectional view showing a main body of a magnetic sensor device according to the first embodiment of the present invention.

The configuration of the magnetic sensor device 1 will now be described. First, a description will be given of a main body 10 of the magnetic sensor device 1. FIG. 2 is a cross-sectional view showing the main body 10 of the magnetic sensor device 1. The magnetic sensor device 1 is a magnetic balance type current sensor. As shown in FIG. 2, the magnetic sensor device 1 includes a coil 11 constituted by the conductor, and a detection circuit 12 including the plurality of magnetic detection elements. The coil 11 and the detection circuit 12 are integrated with each other by a plurality of insulating layers, which will be described later, to constitute the main body 10 of the magnetic sensor device 1. The main body 10 of the magnetic sensor device 1 is independent of the bus bar 2.

Now, we define X, Y and Z directions as shown in FIG. 1 and FIG. 2. The X, Y and Z directions are orthogonal to one another. In this embodiment, the target current Itg shown in FIG. 1 flows in the Y direction. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above".

The main body 10 of the magnetic sensor device 1 is disposed above or below the bus bar 2. The following shows an example in which the main body 10 is disposed above the bus bar 2.

Figure 3:
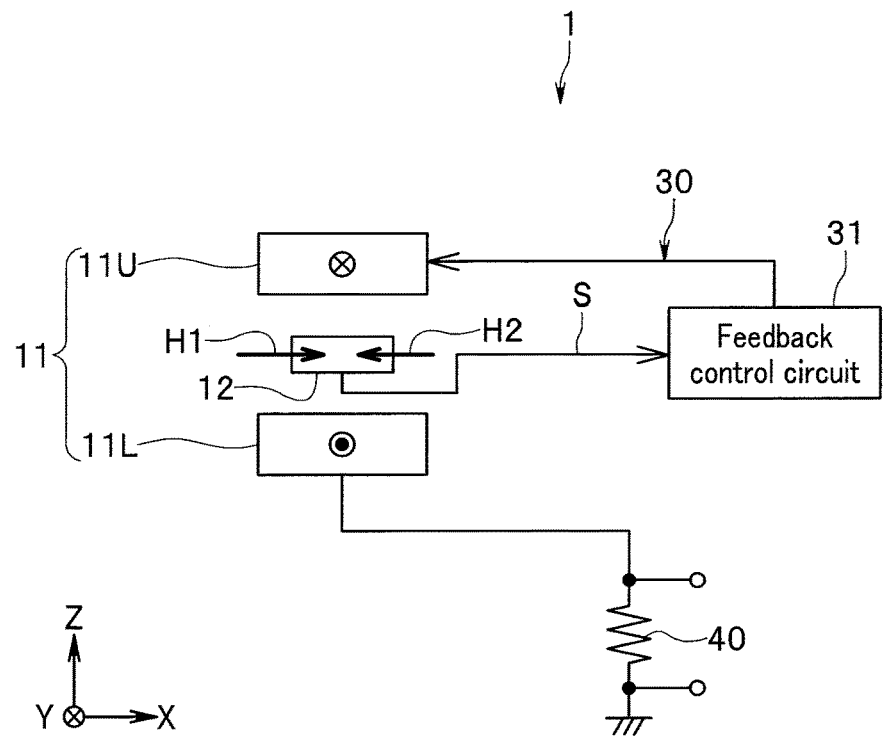
FIG. 3 is a block diagram showing a configuration of the magnetic sensor device according to the first embodiment of the present invention.

A portion of the magnetic field 3 generated by the target current Itg that is detectable by the detection circuit 12 will be referred to as the first magnetic field H1. The coil 11 is to generate a second magnetic field H2 that cancels out the first magnetic field H1. By using the plurality of magnetic detection elements, the detection circuit 12 detects a composite magnetic field of the first magnetic field H1 and the second magnetic field H2 as a target magnetic field that is a magnetic field to be detected. The detection circuit 12 generates a magnetic-field detection value S based on the strength of the target magnetic field. The first magnetic field H1 and the second magnetic field H2 are shown in FIG. 3 to be described later.

In this embodiment, the direction of each of the first and second magnetic fields H1 and H2 and the direction of the target magnetic field are parallel to the X direction. The configuration of the detection circuit 12 will be described in detail later.

As shown in FIG. 2, the magnetic sensor device 1 further includes a substrate 61, and insulating layers 62, 63 and 64. The insulating layer 62 lies on the substrate 61. The detection circuit 12 lies on the insulating layer 62. The insulating layer 63 is disposed to cover the detection circuit 12 and the insulating layer 62. The insulating layer 64 lies on the insulating layer 63. The coil 11 is embedded in the insulating layers 62 to 64 so as not to be in contact with the substrate 61.

The magnetic sensor device 1 may further include a not-shown magnetic layer. The magnetic layer has a function of absorbing a part of the magnetic flux generated by the target current Itg to make the absolute value of the first magnetic field H1 smaller than that in a configuration without the magnetic layer. The magnetic layer is located on the insulating layer 64, for example.

Reference is now made to FIG. 3 to describe portions of the magnetic sensor device 1 other than the main body 10. FIG. 3 is a block diagram showing the configuration of the magnetic sensor device 1. As shown in FIG. 3, the magnetic sensor device 1 further includes a feedback circuit 30 and a current detector 40. The feedback circuit 30 controls, in accordance with the magnetic-field detection value S, a feedback current to be used to generate the second magnetic field H2, and passes the feedback current through the coil 11. The current detector 40 generates a detection value of the feedback current passed through the coil 11. The current detector 40 is, for example, a resistor inserted to a current path of the feedback current. A potential difference across the resistor corresponds to the detection value of the feedback current. The detection value of the feedback current generated by the current detector 40 will hereinafter be referred to as a current detection value. The current detection value is in proportion to the value of the target current Itg. The current detection value thus corresponds to the detection value of the target current Itg.

The feedback circuit 30 includes a feedback control circuit 31. The feedback control circuit 31 generates the feedback current controlled in accordance with the magnetic-field detection value S, and supplies it to the coil 11.

Next, the configuration of the detection circuit 12 will be described in detail. As described above, the detection circuit 12 includes a plurality of magnetic detection elements. The magnetic detection elements may be magnetoresistive elements or Hall elements. A magnetoresistive element will hereinafter be referred to as an MR element. The MR element may be a spin-valve MR element or an anisotropic magnetoresistive (AMR) element. In particular, in the present embodiment, the detection circuit 12 includes a plurality of spin-valve MR elements 50 as the plurality of magnetic detection elements.

Figure 5:
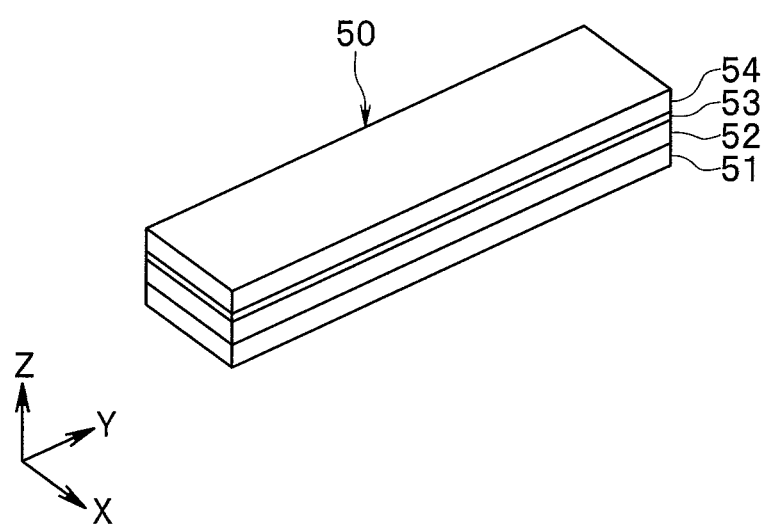
FIG. 5 is a perspective view showing a magnetoresistive element of the magnetic sensor device according to the first embodiment of the present invention.

FIG. 5 is a perspective view showing the MR element 50. The MR element 50 includes a magnetization pinned layer 52 having a magnetization whose direction is fixed, a free layer 54 having a magnetization whose direction is variable depending on the direction of an external magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with an angle that the direction of the magnetization of the free layer 54 forms with respect to the direction of the magnetization of the magnetization pinned layer 52. The resistance is minimized if the angle is 0°. The resistance is maximized if the angle is 180°. In the MR element 50, the free layer 54 has a shape anisotropy that sets the direction of the magnetization easy axis to be orthogonal to the magnetization direction of the magnetization pinned layer 52.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is made of an antiferromagnetic material. The antiferromagnetic layer 51 is in exchange coupling with the magnetization pinned layer 52 so as to pin the magnetization direction of the magnetization pinned layer 52.

Figure 4:
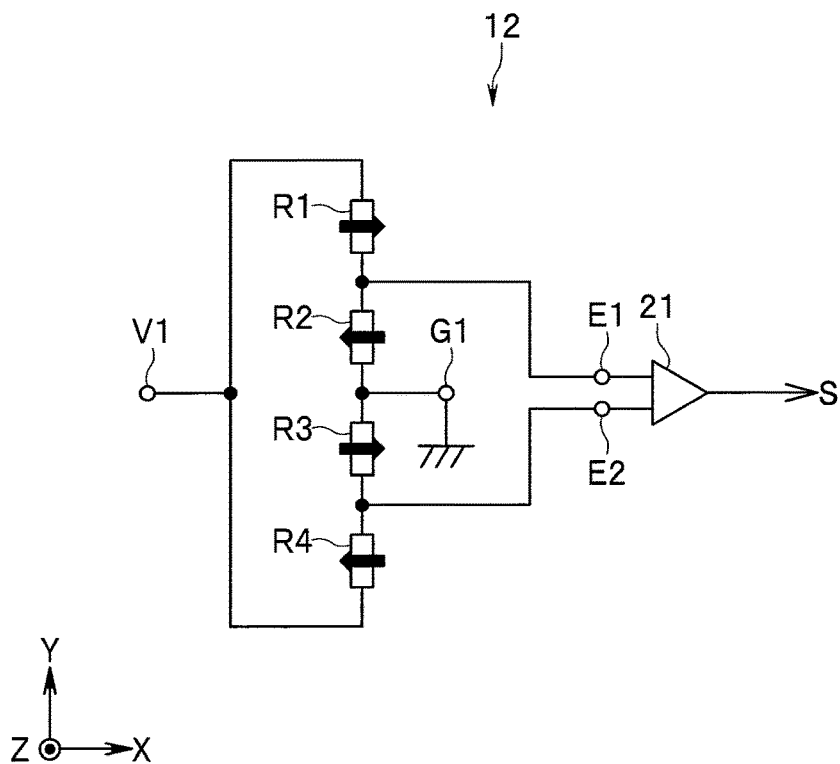
FIG. 4 is a circuit diagram showing a circuit configuration of a detection circuit of the magnetic sensor device according to the first embodiment of the present invention.

FIG. 4 is a circuit diagram showing a circuit configuration of the detection circuit 12. The detection circuit 12 includes a power supply node V1, a ground node G1, two signal output nodes E1 and E2, a differential detector 21, and four resistor sections R1, R2, R3, and R4.

The resistor section R1 is provided between the power supply node V1 and the signal output node E1. The resistor section R2 is provided between the signal output node E1 and the ground node G1. The resistor section R3 is provided between the signal output node E2 and the ground node G1. The resistor section R4 is provided between the power supply node V1 and signal output node E2. The power supply node V1 is configured to receive a power supply voltage of predetermined magnitude. The ground node G1 is connected to the ground.

The resistor sections R1 to R4 each include at least one MR element 50. The magnetization pinned layer 52 of the MR element 50 of each of the resistor sections R1 and R3 has a first magnetization direction. The magnetization pinned layer 52 of the MR element 50 of each of the resistor sections R2 and R4 has a second magnetization direction opposite to the first magnetization direction. Here, a direction parallel to the first and second magnetization directions will be referred to as magnetosensitive direction. The free layer 54 of each MR element 50 preferably has a shape magnetic anisotropy whose easy axis is orthogonal to the magnetosensitive direction.

The magnetic field 3 generated by the target current Itg and a magnetic field generated by the coil 11 are applied to the detection circuit 12. The detection circuit 12 is positioned such that the directions of the aforementioned two magnetic fields to be applied thereto are opposite or substantially opposite to each other, and is oriented such that the magnetosensitive direction is parallel or substantially parallel to the directions of the aforementioned two magnetic fields.

In this example, the first magnetic field H1 is a component in the magnetosensitive direction of the magnetic field generated by the target current Itg and applied to the detection circuit 12. The second magnetic field H2 is a component in the magnetosensitive direction of the magnetic field generated by the coil 11 and applied to the detection circuit 12.

As described above, the direction of the first magnetic field H1 and the direction of the second magnetic field H2 are parallel to the X direction. In such a case, as shown in FIG. 4, the detection circuit 12 is located so that the first magnetization direction is the X direction and the second magnetization direction is the −X direction. In view of the manufacturing accuracy of the MR elements 50 and the alignment accuracy of the detection circuit 12, the first and second magnetization directions may be slightly different from the foregoing directions.

In the detection circuit 12, a potential difference between the signal output nodes E1 and E2 varies depending on the strength of the target magnetic field. The differential detector 21 outputs a magnetic-field detection value S corresponding to the potential difference between the signal output nodes E1 and E2. The strength of the target magnetic field, the potential difference between the signal output nodes E1 and E2, and the magnetic-field detection value S can be of positive or negative values depending on the magnitudes of the first magnetic field H1 and the second magnetic field H2 relative to each other.

Next, the configuration and shape of the coil 11, i.e., the conductor will be described in detail. The coil 11 is wound around the detection circuit 12. As shown in FIGS. 2 and 3, in the present embodiment, the coil 11 includes an upper coil portion 11U located above the detection circuit 12 and a lower coil portion 11L located below the detection circuit 12.

A current flows through the upper coil portion 11U in the Y direction. The current flows through the lower coil portion 11L in the −Y direction.

Figure 6:
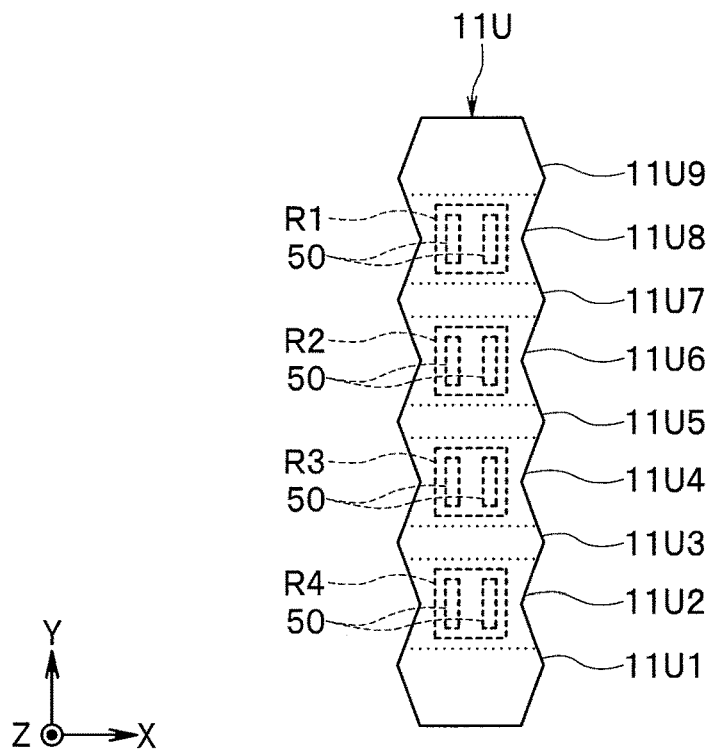
FIG. 6 is a plan view showing a part of a conductor of the magnetic sensor device according to the first embodiment of the present invention.

The configuration and shape of the upper coil portion 11U will now be described. FIG. 6 is a plan view of the upper coil portion 11U. The upper coil portion 11U includes a plurality of conductor portions 11U1, 11U2, 11U3, 11U4, 11U5, 11U6, 11U7, 11U8, and 11U9 extending continuously when viewed in one direction. In FIG. 6, the borders of the conductor portions 11U1 to 11U9 are shown by dotted lines. The conductor portions 11U1 to 11U9 are arranged in this order in the direction in which the current flows (Y direction).

The conductor portions 11U1 to 11U9 extend in a linear direction as a whole. Specifically, the conductor portions 11U1 to 11U9 extend along a direction parallel to the Y direction. The expression "extend in a linear direction as a whole" not only covers a case where the plurality of conductor portions extend along a straight line. The expression is intended to also cover cases where the plurality of conductor portions extend along a curve and where the plurality of conductor portions meander locally but extend in a linear direction or an almost linear direction as a whole when viewed in a specific direction orthogonal to the extending direction. The expression is also intended not to cover a case where the plurality of conductor portions get away from a predetermined position and then return to the predetermined position like when the plurality of conductor portions extend in a U shape or when the plurality of conductor portions extend along a rotational direction. Suppose that the plurality of conductor portions extend along a polygonal line consisting of two line segments of almost the same lengths. In such a case, if the angle formed between the two line segments is an obtuse angle, the plurality of conductor portions can be said to "extend in a linear direction as a whole". If the angle formed between the two line segments is 90° or less, the plurality of conductor portions cannot be said to "extend in a linear direction as a whole".

Take any two adjoining conductor portions among the conductor portions 11U1 to 11U9. While the upper coil portion 11U has a constant dimension in a direction parallel to the Z direction, a dimension of the upper coil portion 11U in a direction parallel to the X direction changes from one of the two conductor portions to the other. The cross-sectional area of the upper coil portion 11U perpendicular to the direction in which the current flows (Y direction) thus changes from one of the two conductor portions to the other. In the following description, when simply referred to as "the cross-sectional area of the upper coil portion 11U", this phrase indicates the area of the cross section of the upper coil portion 11U perpendicular to the direction in which the current flows.

The dimension in the direction parallel to the X direction will hereinafter be referred to as a width, and the dimension in the direction parallel to the Z direction a thickness. An average width of the upper coil portion 11U in one of the two conductor portions is smaller than that of the upper coil portion 11U in the other. An average cross-sectional area of the upper coil portion 11U in one of the two conductor portions is thus smaller than that of the upper coil portion 11U in the other. An average of widths (cross-sectional areas) obtained at predetermined intervals in a conductor portion may be regarded as the "average width (cross-sectional area)". An average of the maximum and minimum values of the width (cross-sectional area) in the conductor portion may be regarded as the "average width (cross-sectional area)".

Of the two conductor portions, one where the average cross-sectional area of the upper coil position 11U is smaller will be referred to as a first conductor portion. The other conductor portion where the average cross-sectional area of the upper coil position 11U is greater will be referred to as a second conductor portion. A conductor portion that is located on a side opposite to the second conductor portion with respect to the first conductor portion and continuous with the first conductor portion will be referred to as a third conductor portion. In the present embodiment, the upper coil portion 11U has a constant thickness, whereas the width of the upper coil portion 11U changes from the first conductor portion to the third conductor portion. The cross-sectional area of the upper coil portion 11U thus changes from the first conductor portion to the third conductor portion. An average width of the upper coil portion 11U in each of the second and third conductor portions is greater than that of the upper coil portion 11U in the first conductor portion. Focusing attention on the first to third conductor portions, the upper coil portion 11U therefore has a shape constricted in the first conductor portion. The average cross-sectional area of the upper coil portion 11U in each of the second and third conductor portions is also greater than that of the upper coil portion 11U in the first conductor portion.

The first conductor portion is located at a position where a first partial magnetic field occurring from the first conductor portion due to the current flowing through the coil 11 is applied to magnetic detection elements, i.e., MR elements 50. The second and third conductor portions are located at positions where second and third partial magnetic fields occurring from the second and third conductor portions due to the current flowing through the coil 11 are not applied to the magnetic detection elements, i.e., MR elements 50, or positions where each of the second and third partial magnetic fields applied to the MR elements 50 has strength lower than that of the first partial magnetic field applied to the MR elements 50. In other words, the MR elements 50 are located at positions where the first partial magnetic field occurring from the first conductor portion is applied thereto and the second and third partial magnetic fields occurring from the second and third conductor portions are not applied, or positions where the first to third partial magnetic fields are applied thereto and each of the second and third partial magnetic fields has strength lower than that of the first partial magnetic field.

FIG. 6 shows the resistor sections R1 to R4 of the detection circuit 12 and the positions and orientations of the MR elements 50 included in each of the resistor sections R1 to R4. For ease of understanding, in FIG. 6, the number of MR elements 50 included in each of the resistor sections R1 to R4 is two. However, the number of MR elements 50 included in each of the resistor sections R1 to R4 may be one, or three or more.

In particular, in the present embodiment, the conductor portions 11U2, 11U4, 11U6, and 11U8 correspond to the first conductor portions. The conductor portions 11U1, 11U3, 11U5, 11U7, and 11U9 correspond to the second or third conductor portions.

The first partial magnetic field occurring from the conductor portion 11U8 is mainly applied to the MR elements 50 in the resistor section R1. The second partial magnetic field occurring from each of the conductor portions 11U7 and 11U9 and applied to the MR elements 50 in the resistor section R1 has strength lower than that of the first partial magnetic field occurring from the conductor portion 11U8 and applied to the MR elements 50 in the resistor section R1. The second partial magnetic field occurring from each of the conductor portions 11U7 and 11U9 does not need to be applied to the MR elements 50 in the resistor section R1.

The first partial magnetic field occurring from the conductor portion 11U6 is mainly applied to the MR elements 50 in the resistor section R2. The second partial magnetic field occurring from each of the conductor portions 11U5 and 11U7 and applied to the MR elements 50 in the resistor section R2 has strength lower than that of the first partial magnetic field occurring from the conductor portion 11U6 and applied to the MR elements 50 in the resistor section R2. The second partial magnetic field occurring from each of the conductor portions 11U5 and 11U7 does not need to be applied to the MR elements 50 in the resistor section R2.

The first partial magnetic field occurring from the conductor portion 11U4 is mainly applied to the MR elements 50 in the resistor section R3. The second partial magnetic field occurring from each of the conductor portions 11U3 and 11U5 and applied to the MR elements 50 in the resistor section R3 has strength lower than that of the first partial magnetic field occurring from the conductor portion 11U4 and applied to the MR elements 50 in the resistor section R3. The second partial magnetic field occurring from each of the conductor portions 11U3 and 11U5 does not need to be applied to the MR elements 50 in the resistor section R3.

The first partial magnetic field occurring from the conductor portion 11U2 is mainly applied to the MR elements 50 in the resistor section R4. The second partial magnetic field occurring from each of the conductor portions 11U1 and 11U3 and applied to the MR elements 50 in the resistor section R4 has strength lower than that of the first partial magnetic field occurring from the conductor portion 11U2 and applied to the MR elements 50 in the resistor section R4. The second partial magnetic field occurring from each of the conductor portions 11U1 and 11U3 does not need to be applied to the MR elements 50 in the resistor section R4.

In the example shown in FIG. 6, the dimension of the upper coil portion 11U in the direction parallel to the X direction changes continuously, while alternately repeating increase and decrease. The cross-sectional area of the upper coil portion 11U therefore also changes continuously, while alternately repeating increase and decrease. However, the dimension of the upper coil portion 11U and the cross-sectional area of the upper coil portion 11U may increase or decrease stepwise or be constant at least in some of the conductor portions.

Figure 7:
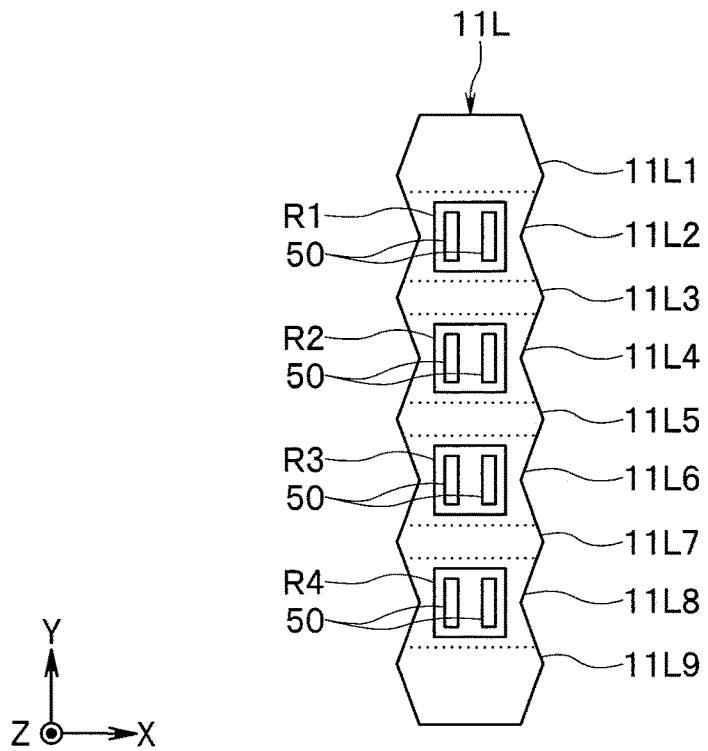
FIG. 7 is a plan view showing another part of the conductor of the magnetic sensor device according to the first embodiment of the present invention.

Next, the configuration and shape of the lower coil portion 11L will be described. In the present embodiment, the configuration and shape of the lower coil portion 11L are the same as those of the upper coil portion 11U. The lower coil portion 11L includes a plurality of conductor portions 11L1, 11L2, 11L3, 11L4, 11L5, 11L6, 11L7, 11L8, and 11L9 extending continuously when viewed in one direction. In FIG. 7, the borders of the conductor portions 11L1 to 11L9 are shown by dotted lines. The conductor portions 11L1 to 11L9 are arranged in this order in the direction in which the current flows (−Y direction).

The conductor portions 11L1 to 11L9 extend in a linear direction as a whole. Take any two adjoining conductor portions among the conductor portions 11L1 to 11L9. While the lower coil portion 11L has a constant thickness, a width of the lower coil portion 11L changes from one of the two conductor portions to the other. The cross-sectional area of the lower coil portion 11L perpendicular to the direction in which the current flows (−Y direction) thus changes from one of the two conductor portions to the other. In the following description, when simply referred to as "the cross-sectional area of the lower coil portion 11L", this phrase indicates the area of the cross section of the lower coil portion 11L perpendicular to the direction in which the current flows.

An average width of the lower coil portion 11L in one of the two conductor portions is smaller than that of the lower coil portion 11L in the other. An average cross-sectional area of the lower coil portion 11L in one of the two conductor portions is smaller than that of the lower coil portion 11L in the other.

Like the upper coil portion 11U, one of the two conductor portions where the average cross-sectional area of the lower coil portion 11L is smaller will be referred to as a first conductor portion. The other conductor portion where the average cross-sectional area of the lower coil portion 11L is greater will be referred to as a second conductor portion. A conductor portion that is located on a side opposite to the second conductor portion with respect to the first conductor portion and continuous with the first conductor portion will be referred to as a third conductor portion. In the present embodiment, the lower coil portion 11L has a constant thickness, whereas the width of the lower coil portion 11L changes from the first conductor portion to the third conductor portion. The cross-sectional area of the lower coil portion 11L thus changes from the first conductor portion to the third conductor portion. An average width of the lower coil portion 11L in each of the second and third conductor portions is greater than that of the lower coil portion 11L in the first conductor portion. Focusing attention on the first to third conductor portions, the lower coil portion 11L therefore has a shape constricted in the first conductor portion. The average cross-sectional area of the lower coil portion 11L in each of the second and third conductor portions is also greater than that of the lower coil portion 11L in the first conductor portion.

FIG. 7 shows the resistor sections R1 to R4 of the detection circuit 12 and the positions and orientations of the MR elements 50 included in each of the resistor sections R1 to R4. In particular, in the present embodiment, the conductor portions 11L2, 11L4, 11L6, and 11L8 correspond to the first conductor portions. The conductor portions 11L1, 11L3, 11L5, 11L7, and 11L9 correspond to the second or third conductor portions.

The first partial magnetic field occurring from the conductor portion 11L2 is mainly applied to the MR elements 50 in the resistor section R1. The second partial magnetic field occurring from each of the conductor portions 11L1 and 11L3 and applied to the MR elements 50 in the resistor section R1 has strength lower than that of the first partial magnetic field occurring from the conductor portion 11L2 and applied to the MR elements 50 in the resistor section R1. The second partial magnetic field occurring from each of the conductor portions 11L1 and 11L3 does not need to be applied to the MR elements 50 in the resistor section R1.

The first partial magnetic field occurring from the conductor portion 11L4 is mainly applied to the MR elements 50 in the resistor section R2. The second partial magnetic field occurring from each of the conductor portions 11L3 and 11L5 and applied to the MR elements 50 in the resistor section R2 has strength lower than that of the first partial magnetic field occurring from the conductor portion 11L4 and applied to the MR elements 50 in the resistor section R2. The second partial magnetic field occurring from each of the conductor portions 11L3 and 11L5 does not need to be applied to the MR elements 50 in the resistor section R2.

The first partial magnetic field occurring from the conductor portion 11L6 is mainly applied to the MR elements 50 in the resistor section R3. The second partial magnetic field occurring from each of the conductor portions 11L5 and 11L7 and applied to the MR elements 50 in the resistor section R3 has strength lower than that of the first partial magnetic field occurring from the conductor portion 11L6 and applied to the MR elements 50 in the resistor section R3. The second partial magnetic field occurring from each of the conductor portions 11L5 and 11L7 does not need to be applied to the MR elements 50 in the resistor section R3.

The first partial magnetic field occurring from the conductor portion 11L8 is mainly applied to the MR elements 50 in the resistor section R4. The second partial magnetic field occurring from each of the conductor portions 11L7 and 11L9 and applied to the MR elements 50 in the resistor section R4 has strength lower than that of the first partial magnetic field occurring from the conductor portion 11L8 and applied to the MR elements 50 in the resistor section R4. The second partial magnetic field occurring from each of the conductor portions 11L7 and 11L9 does not need to be applied to the MR elements 50 in the resistor section R4.

In the example shown in FIG. 7, the dimension of the lower coil portion 11L in the direction parallel to the X direction changes continuously, while alternately repeating increase and decrease. The cross-sectional area of the lower coil portion 11L therefore also changes continuously, while alternately repeating increase and decrease. However, the dimension of the lower coil portion 11L and the cross-sectional area of the lower coil portion 11L may increase or decrease stepwise or be constant at least in some of the conductor portions.

The function and effect of the magnetic sensor device 1 according to the present embodiment will now be described. In the present embodiment, the coil 11 includes the conductor portions 11U1 to 11U9 and 11L1 to 11L9. Since the conductor of the present embodiment constitutes the coil 11, the conductor can also be said to include the conductor portions 11U1 to 11U9 and 11L1 to 11L9. The conductor portions 11U2, 11U4, 11U6, 11U8, 11L2, 11L4, 11L6, and 11L8 correspond to the first conductor portions. The conductor portions 11U1, 11U3, 11U5, 11U7, 11U9, 11L1, 11L3, 11L5, 11L7, and 11L9 correspond to the second or third conductor portions.

The first conductor portions are located at positions where the magnetic fields occurring from the first conductor portions due to the current flowing through the coil 11 are applied to the MR elements 50. The average cross-sectional area of the upper coil portion 11U, or conductor, in the first conductor portions is smaller than that of the upper coil portion 11U, or conductor, in the second and third conductor portions. Similarly, the average cross-sectional area of the lower coil portion 11L, or conductor, in the first conductor portions is smaller than that of the lower coil portion 11L, or conductor, in the second and third conductor portions.

According to the present embodiment, the current density in the first conductor portions can be increased to increase the strength of the magnetic field applied to the MR elements 50, compared to a case where the cross-sectional area of the entire conductor constituting the coil 11 is the same as the average cross-sectional area of the conductor in the second and third conductor portions. In addition, according to the present embodiment, the resistances in the second and third conductor portions can be reduced to reduce the resistance of the entire conductor, compared to the case where the cross-sectional area of the entire conductor constituting the coil 11 is the same as the average cross-sectional area of the conductor in the first conductor portions. According to the present embodiment, the resistance of the conductor constituting the coil 11 can thus be reduced while increasing the strength of the magnetic field applied to the MR elements 50.

Second Embodiment

A second embodiment of the invention will now be described. An outline of a magnetic sensor system including a magnetic sensor device according to the present embodiment will initially be described with reference to FIG. 8. A magnetic sensor system 100 of the present embodiment includes a magnetic sensor device 101 according to the present embodiment and a magnetic field generator 5. The magnetic field generator 5 generates a target magnetic field MF that is a magnetic field for the magnetic sensor device 101 to detect (magnetic field to be detected).

The magnetic field generator 5 is rotatable about a rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor device 101 is located at a position where the target magnetic field MF at a predetermined reference position can be detected. The reference position may be located on the rotation axis C. In the following description, the reference position is located on the rotation axis C. The magnetic sensor device 101 detects the target magnetic field MF generated by the magnetic field generator 5, and generates a detection value Vs. The detection value Vs has a correspondence with a relative position, or rotational position in particular, of the magnetic field generator 5 with respect to the magnetic sensor device 101.

Figure 8:
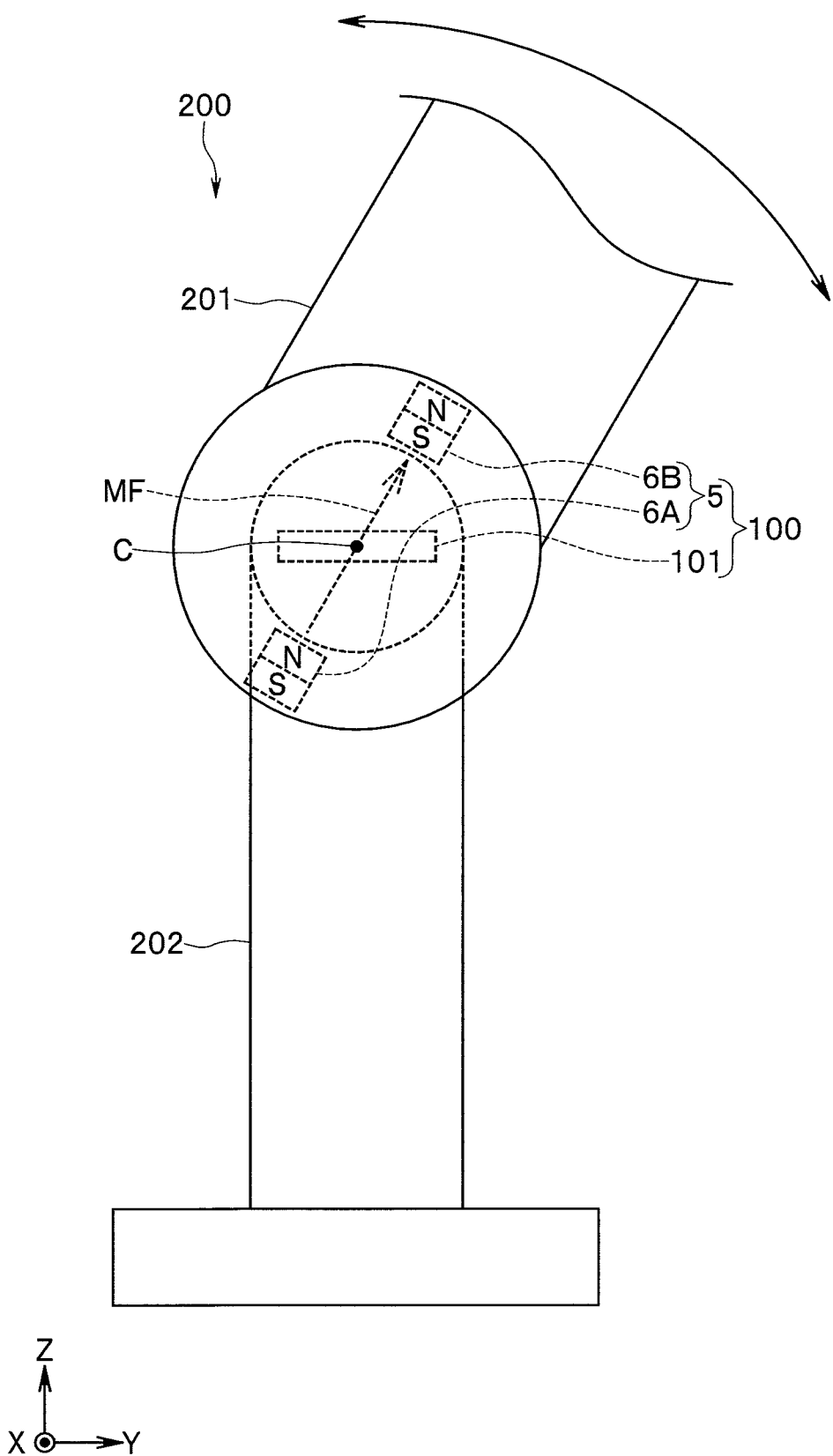
FIG. 8 is an explanatory diagram showing a schematic configuration of a magnetic sensor system of a second embodiment of the present invention.

The magnetic sensor system 100 can be used as a device for detecting the rotational position of a rotatable moving part in an apparatus that includes the moving part. Examples of such an apparatus include a joint of an industrial robot. FIG. 8 shows an example where the magnetic sensor system 100 is applied to an industrial robot 200.

The industrial robot 200 shown in FIG. 8 includes a moving part 201 and a support unit 202 that rotatably supports the moving part 201. The moving part 201 and the support unit 202 are connected at a joint. The moving part 201 rotates about the rotation axis C. For example, if the magnetic sensor system 100 is applied to the joint of the industrial robot 200, the magnetic sensor device 101 may be fixed to the support unit 202, and the magnets 6A and 6B may be fixed to the moving part 201.

Now, we define X, Y, and Z directions as shown in FIG. 8. The X, Y, and Z directions are orthogonal to one another. In the present embodiment, a direction parallel to the rotation axis C (in FIG. 8, a direction out of the plane of the drawing) will be referred to as the X direction. In FIG. 8, the Y direction is shown as a rightward direction, and the Z direction is shown as an upward direction. The opposite directions to the X, Y, and Z directions will be referred to as −X, −Y, and −Z directions, respectively. The direction of the target magnetic field MF rotates within the YZ plane, about the reference position on the rotation axis C.

The magnetic sensor device 101 includes a magnetic detection element for detecting an external magnetic field, and a conductor through which a current flows. In particular, in the present embodiment, the magnetic detection element is an MR element. The magnetic sensor device 101 includes a plurality of MR elements. The conductor constitutes a coil to be described below.

Figure 9:
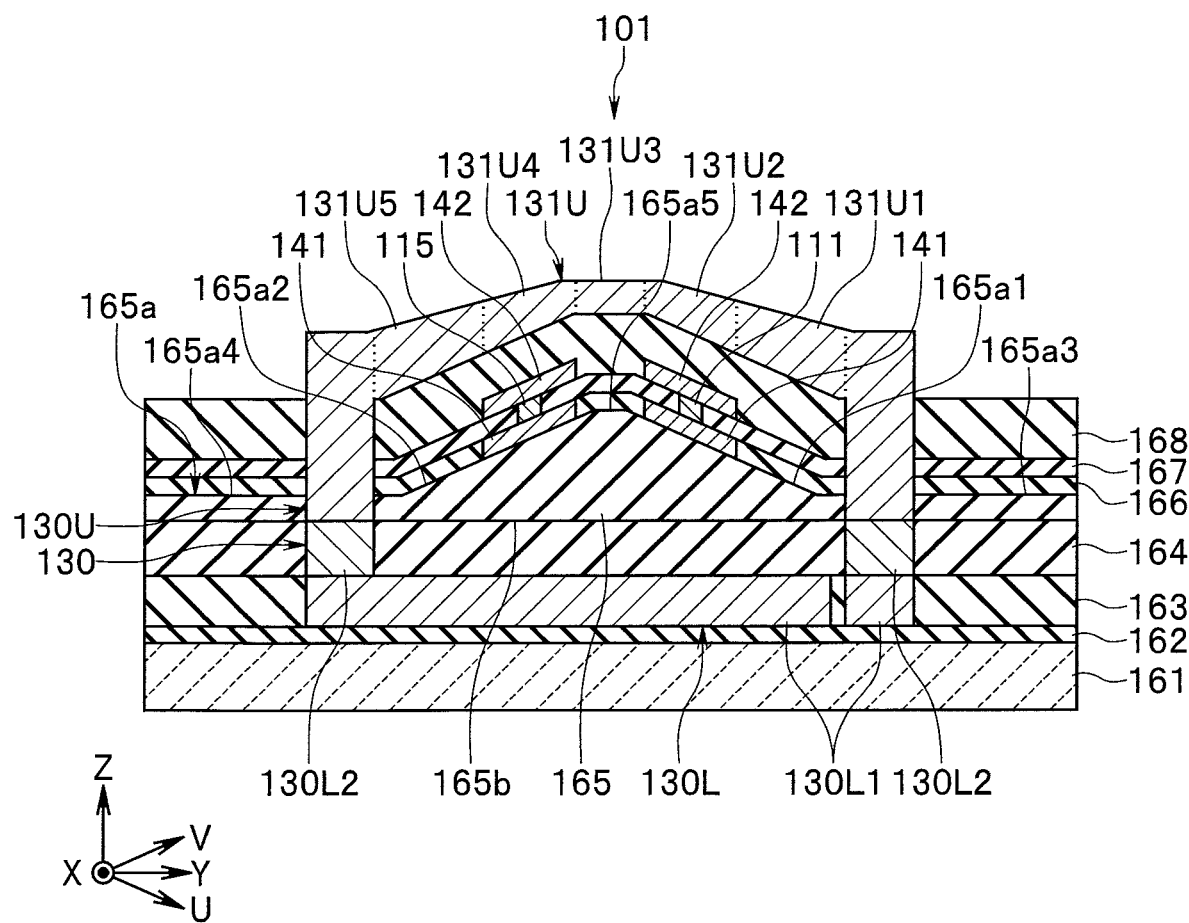
FIG. 9 is a sectional view showing a cross section of a magnetic sensor device according to the second embodiment of the present invention.
Figure 10:
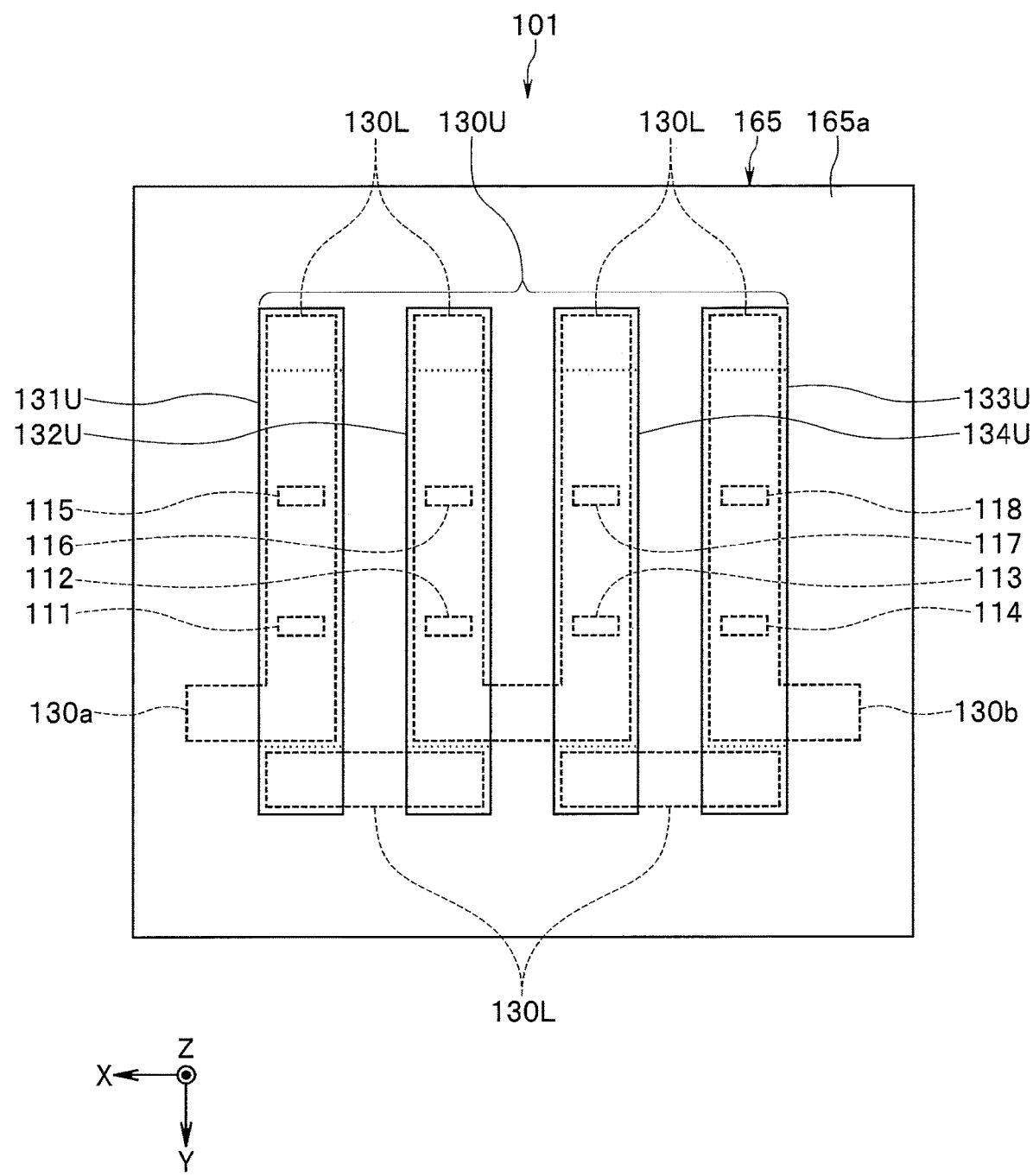
FIG. 10 is a plan view showing the magnetic sensor device according to the second embodiment of the present invention.
Figure 11:
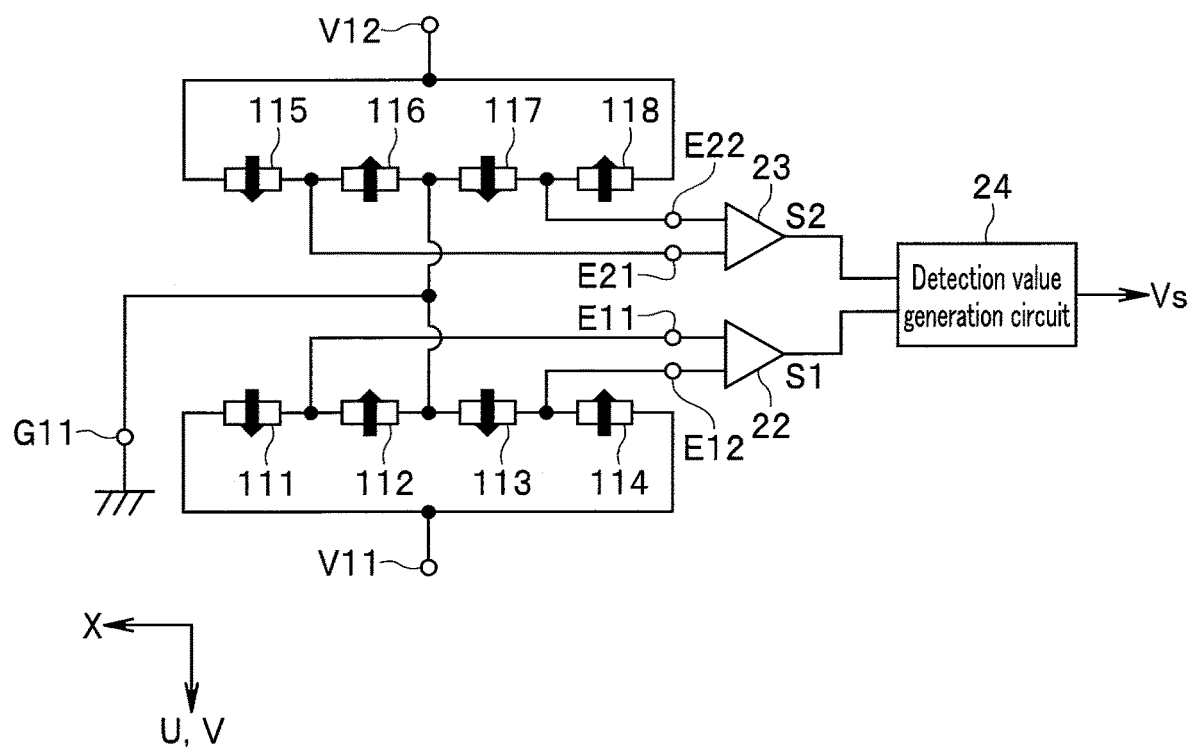
FIG. 11 is a circuit diagram showing a circuit configuration of the magnetic sensor device according to the second embodiment of the present invention.

Next, a configuration of the magnetic sensor device 101 according to the present embodiment will be described with reference to FIGS. 9 to 11. FIG. 9 is a sectional view showing a cross section of the magnetic sensor device 101. FIG. 10 is a plan view showing the magnetic sensor device 101. FIG. 11 is a circuit diagram showing the circuit configuration of the magnetic sensor device 101.

The magnetic sensor device 101 includes eight MR elements 111, 112, 113, 114, 115, 116, 117, and 118, and a support member 165 that supports the MR elements 111 to 118. Each of the MR elements 111 to 118 is configured to be able to detect the target magnetic field MF. For example, the support member 165 includes an insulating layer made of an insulating material such as $SiO_2$.

As shown in FIG. 9, the support member 165 includes a top surface 165a opposed to the MR elements 111 to 118, and a bottom surface 165b located on a side opposite to the top surface 165a. The top surface 165a is located at an end of the support member 165 in the Z direction. The bottom surface 165b is located at an end of the support member 165 in the −Z direction. The bottom surface 165b is parallel to the XY plane.

The top surface 165a of the support member 165 includes two inclined portions 165a1 and 165a2 symmetrical about the ZX plane. The entirety of each of the inclined portions 165a1 and 165a2 is perpendicular to the YZ plane and inclined relative to the bottom surface 165b.

The top surface 165a of the support member 165 further includes three flat portions 165a3, 165a4, and 165a5. The flat portion 165a3 is connected to the bottom end of the inclined portion 165a1. The flat portion 165a4 is connected to the bottom end of the inclined portion 165a2. The flat portion 165a5 is connected to the top end of the inclined portion 165a1 and the top end of the inclined portion 165a2. All the flat portions 165a3 to 165a5 are parallel to the XY plane.

In view of the manufacturing accuracy and the like of the magnetic sensor device 101, the inclined portions 165a1 and 165a2 may be curved. In such a case, the top end of the inclined portion 165a1 and that of the inclined portion 165a2 may be connected to each other.

The MR elements 111 to 114 are located on the inclined portion 165a1. The MR elements 115 to 118 are located on the inclined portion 165a2. Lower electrodes to be described later are interposed between the MR elements 111 to 118 and the support member 165. As shown in FIG. 10, the MR elements 111 to 114 are arranged in a row in this order along the −X direction. The MR elements 115 to 118 are arranged in a row in this order along the −X direction, at positions in front of the MR elements 111 to 114 in the −Y direction.

The MR elements 111 and 115 are located at positions symmetrical or substantially symmetrical about the XZ plane that intersects the flat portion 165a5 in the center in a direction parallel to the Y direction. Similarly, the MR elements 112 and 116 are located at positions symmetrical or substantially symmetrical about the XZ plane. Similarly, the MR elements 113 and 117 are located at positions symmetrical or substantially symmetrical about the XZ plane. Similarly, the MR elements 114 and 118 are located at positions symmetrical or substantially symmetrical about the XZ plane.

The magnetic sensor device 101 further includes a coil 130 constituted by the conductor. The MR elements 111 to 118 are integrated with the coil 130. The coil 30 generates a coil magnetic field which is a magnetic field to be applied to the MR elements 111 to 118.

The coil 130 includes a first end 130a and a second end 130b located at both longitudinal ends of the conductor constituting the coil 130. The first and second ends 130a and 130b are connected to a not-shown power supply. The coil 130 is wound around the MR elements 111 to 118. In particular, in the present embodiment, the coil 130 is wound so that a coil magnetic field in the X or −X direction is applied to each of the MR elements 111 to 118. For example, if a current is passed in a direction from the first end 130a to the second end 130b, a coil magnetic field in the −X direction is applied to the MR elements 111, 113, 115, and 117, and a coil magnetic field in the X direction is applied to the MR elements 112, 114, 116, and 118. If a current is passed in a direction from the second end 130b to the first end 130a, a coil magnetic field in the X direction is applied to the MR elements 111, 113, 115, and 117, and a coil magnetic field in the −X direction is applied to the MR elements 112, 114, 116, and 118.

The coil 130 includes upper coil portions 130U located on the Z direction side with respect to the bottom surface 165b of the support member 165, and lower coil portions 130L located on the −Z direction side with respect to the bottom surface 165b of the support member 165. In FIG. 10, the lower coil portions 130L are shown by broken lines.

The magnetic sensor device 101 further includes a plurality of lower electrodes 141 and a plurality of upper electrodes 142 that electrically connect the MR elements 111 to 118, a substrate 161, and insulating layers 162, 163, 164, 166, 167, and 168. The insulating layer 162 is located on the substrate 161. The lower coil portions 130L include a plurality of first layers 130L1 located on the insulating layer 162, and a plurality of second layers 130L2 located on the plurality of first layers 130L1. The insulating layer 163 is located on the insulating layer 162, around the plurality of first layers 130L1. The insulating layer 164 is located on the first layers 130L1 and the insulating layer 163, around the second layers 130L2. The support member 165 is located on the second layers 130L2 and the insulating layer 164.

The plurality of lower electrodes 141 are located on the top surface 165a of the support member 165. Each of the plurality of lower electrodes 141 is mainly located on the inclined portion 165a1 or 165a2 of the top surface 165a of the support member 165. The insulating layer 166 is located on the top surface 165a of the support member 165, around the plurality of lower electrodes 141. The MR elements 111 to 118 are located on the plurality of lower electrodes 141. The insulating layer 167 is located on the plurality of lower electrodes 141 and the insulating layer 166, around the MR elements 111 to 118. The plurality of upper electrodes 142 are located on the MR elements 111 to 118 and the insulating layer 167. The insulating layer 168 is located on the plurality of upper electrodes 142 and the insulating layer 167. In FIG. 10, the plurality of lower electrodes 141, the plurality of upper electrodes 142, and the insulating layers 166 to 168 are omitted.

The upper coil portions 130U are mainly located on the insulating layer 168. A plurality of through holes are formed through the support member 165 and the insulating layers 166 to 168, from the top surface of the insulating layer 168 to the bottom surface 165b of the support member 165. The upper coil portions 130U and the lower coil portions 130L are connected to each other via the plurality of through holes.

The plurality of lower electrodes 141 and the plurality of upper electrodes 142 are made of a conductive material such as Cu. The substrate 161 is a semiconductor substrate made of a semiconductor such as Si, for example. The insulating layers 162 to 164 and 166 to 168 are made of an insulating material such as $SiO_2$, for example.

The magnetic sensor device 101 further includes a not-shown insulating layer covering the upper coil portions 130U and the insulating layer 168. The not-shown insulating layer is made of an insulating material such as $SiO_2$, for example.

Note that the second layers 130L2 of the lower coil portions 130L and the insulating layer 164 may be omitted. In such a case, the support member 165 is located on the first layers 130L1 of the lower coil portions 130L and the insulating layer 163.

As shown in FIG. 11, the magnetic sensor device 101 further includes two power supply nodes V11 and V12, a ground node G11, four signal output nodes E11, E12, E21, and E22, and two differential detectors 22 and 23. The MR element 111 is arranged between the power supply node V11 and the signal output node E11. The MR element 112 is arranged between the signal output node E11 and the ground node G11. The MR element 113 is arranged between the signal output node E12 and the ground node G11. The MR element 114 is arranged between the power supply node V11 and the signal output node E12. A predetermined magnitude of power supply voltage is applied to the power supply node V11. The ground node G11 is connected to the ground. The differential detector 22 outputs a signal corresponding to a potential difference between the signal output nodes E11 and E12 as a detection signal S1.

The MR element 115 is arranged between the power supply node V12 and the signal output node E21. The MR element 116 is arranged between the signal output node E21 and the ground node G11. The MR element 117 is arranged between the signal output node E22 and the ground node G11. The MR element 118 is arranged between the power supply node V12 and the signal output node E22. Like the power supply node V11, a predetermined magnitude of power supply voltage is applied to the power supply node V12. The differential detector 23 outputs a signal corresponding to a potential difference between the signal output nodes E21 and E22 as the detection signal S2.

The magnetic sensor device 101 further includes a detection value generation circuit 24 that generates the detection value Vs on the basis of the detection signals S1 and S2. The detection value generation circuit 24 includes an application specific integrated circuit (ASIC) or a microcomputer, for example. A method for generating the detection value Vs will be described later.

The configuration of the MR elements 111 to 118 will now be described in detail. Like the MR elements 50 described with reference to FIG. 5 in the first embodiment, each of the MR elements 111 to 118 is a spin-valve MR element. The MR elements 111 to 118 each have the same configuration as that of the MR element 50. Specifically, the MR elements 111 to 118 each include a magnetization pinned layer 52 having a magnetization whose direction is fixed, a free layer 54 having a magnetization whose direction is variable depending on the direction of an external magnetic field, a gap layer 53 located between the magnetization pinned layer 52 and the free layer 54, and an antiferromagnetic layer 51.

Each of the lower electrodes 141 has a long slender shape. Every two lower electrodes 141 adjacent to each other in the longitudinal direction of the lower electrodes 141 have a gap therebetween. One of the MR elements 111 to 118 is located on the top surface of each lower electrode 141, near a longitudinal end thereof. Although not shown in the drawings, the antiferromagnetic layer 51, the magnetization pinned layer 52, the gap layer 53, and the free layer 54 are stacked in this order from the lower electrode 141 side.

Each of the upper electrodes 142 has a long slender shape, and establishes electrical connection between the respective free layers 54 of two adjacent MR elements that are arranged on two lower electrodes 141 adjacent in the longitudinal direction of the lower electrodes 141. The layers 51 to 54 may be arranged in reverse order to that in the foregoing description.

In the present embodiment, the coil magnetic field generated by the coil 130 is used to set the magnetization direction of the free layer 54 in each of the MR elements 111 to 118 to a predetermined direction, i.e., the X direction or the −X direction. The coil magnetic field may be temporarily applied to each of the MR elements 111 to 118. According to the present embodiment, the directions of the magnetization of the free layers 54 upon starting use of the magnetic sensor device 101 can be aligned to a predetermined direction.

Next, a method for generating the detection value Vs of the present embodiment will be described. In describing any one of the MR elements 111 to 114, the MR element will hereinafter be denoted by the reference numeral 110A. In describing any one of the MR elements 115 to 118, the MR element will be denoted by the reference numeral 110B. The MR element 110A will be referred to as a first MR element 110A, and the MR element 110B a second MR element 110B.

A direction parallel to the surfaces of the layers constituting the first MR element 110A and orthogonal to the X direction will be referred to as a U direction. FIG. 9 shows the U direction. As shown in FIG. 9, the U direction is also parallel to the inclined portion 165a1. The direction opposite to the U direction will be referred to as a −U direction. The first MR element 110A is located on the inclined portion 165a1 in an orientation such that the surfaces of the layers are oblique to the XY plane. This makes the U direction different from the Y or −Y direction. In the present embodiment, the U direction is a direction rotated from the Y direction toward the −Z direction by α. α is an angle of greater than 0° and smaller than 90°.

Figure 12:
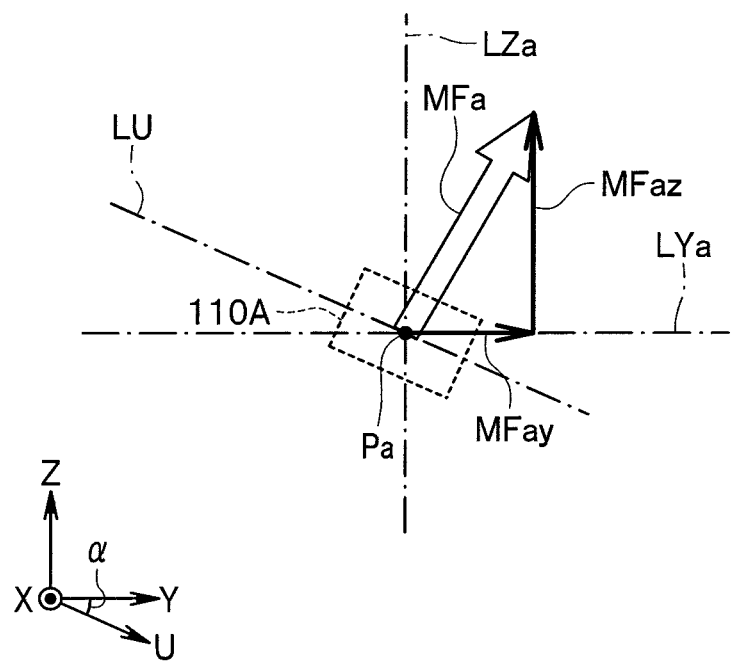
FIG. 12 is an explanatory diagram for describing a target magnetic field for a first magnetoresistive element of the second embodiment of the present invention to detect.

FIG. 12 is an explanatory diagram for describing a target magnetic field MF for the first MR element 110A to detect. In FIG. 12, the position where the first MR element 110A detects the target magnetic field MF is denoted by the symbol Pa. In the present embodiment, the direction and strength of the target magnetic field MF at the position Pa coincide with those of the target magnetic field MF at the reference position on the rotation axis C (see FIG. 8). The direction of the target magnetic field MF at the position Pa rotates about the position Pa. The target magnetic field MF at the position Pa will hereinafter be denoted by the symbol MFa.

In FIG. 12, an imaginary straight line that passes the position Pa and is parallel to the Y direction will be denoted by the symbol LYa. An imaginary straight line that passes the position Pa and is parallel to the Z direction will be denoted by the symbol LZa. An imaginary straight line that passes the position Pa and is parallel to the U direction will be denoted by the symbol LU.

In the magnetic sensor device 101, the directions of the magnetization of the magnetization pinned layers 52 in the MR elements 111 to 114 and the shape anisotropy of the free layers 54 in the MR elements 111 to 114 are set so that the strength of the component of the target magnetic field MFa in the direction parallel to the U direction can be detected. In FIG. 11, the thick arrows indicate the directions of the magnetization in the magnetization pinned layers 52. The X and U directions are shown in FIG. 11. As shown in FIG. 11, in the present embodiment, the directions of the magnetization of the magnetization pinned layers 52 in the MR elements 111 and 113 are the U direction. The directions of the magnetization of the magnetization pinned layers 52 in the MR elements 112 and 114 are the −U direction. The free layers 54 have shape anisotropy such that the direction of the easy axis of magnetization is parallel to the X direction.

As shown in FIG. 12, the target magnetic field MFa can be regarded as a composite magnetic field of a magnetic field MFay in a direction parallel to the Y direction and a magnetic field MFaz in a direction parallel to the Z direction. The MR elements 111 to 114 each detect a composite magnetic field of a component of the magnetic field MFay in a direction parallel to the U direction and a component of the magnetic field MFaz in the direction parallel to the U direction. A component in the direction parallel to the U direction will hereinafter be referred to as a U component. The composite magnetic field of the U component of the magnetic field MFay and the U component of the magnetic field MFaz will be referred to as a first composite magnetic field. The differential detector 22 outputs a signal having a correspondence with the strength of the first composite magnetic field as the detection signal S1.

The strength of the first composite magnetic field is equal to the sum of the strength of the U component of the magnetic field MFay and the strength of the U component of the magnetic field MFaz. Here, the strength of the magnetic field MFay will be denoted by the symbol By, and the strength of the magnetic field MFaz by the symbol Bz. The strength By is expressed in positive values when the direction of the magnetic field MFay is the Y direction, and in negative values when the direction of the magnetic field MFay is the −Y direction. The strength Bz is expressed in positive values when the direction of the magnetic field MFaz is the Z direction, and in negative values when the direction of the magnetic field MFaz is the −Z direction. The ratio of a change in the detection signal S1 to a change in the strength of the first composite magnetic field will be denoted by the symbol Sa. The detection signal S1 is expressed by the following Eq. (1):

$$S1 = Sa^* (By^* \cos \alpha - Bz^* \sin \alpha) \quad (1)$$

The strength of a U component is expressed in positive values when the direction of the U component is the U direction, and in negative values when the direction of the U component is the −U direction. The positive or negative sign of the strength of the U component of the magnetic field MFay coincides with that of the strength By of the magnetic field MFay. By contrast, the positive or negative sign of the strength of the U component of the magnetic field MFaz is opposite to that of the strength Bz of the magnetic field MFaz. In Eq. (1), the strength of the U component of the magnetic field MFay is therefore expressed as "$By^* \cos \alpha$", and the strength of the U component of the magnetic field MFaz is expressed as "$-Bz^* \sin \alpha$".

A direction parallel to the surfaces of the layers constituting the second MR element 110B and orthogonal to the X direction will be referred to as a V direction. FIG. 9 shows the V direction. As shown in FIG. 9, the V direction is also parallel to the inclined portion 165a2. The direction opposite to the V direction will be referred to as a −V direction. The second MR element 110B is located on the inclined portion 165a2 in an orientation such that the surfaces of the layers are oblique to the XY plane. This makes the V direction different from the Y or −Y direction. In the present embodiment, the V direction is a direction rotated from the Y direction toward the Z direction by α.

Figure 13:
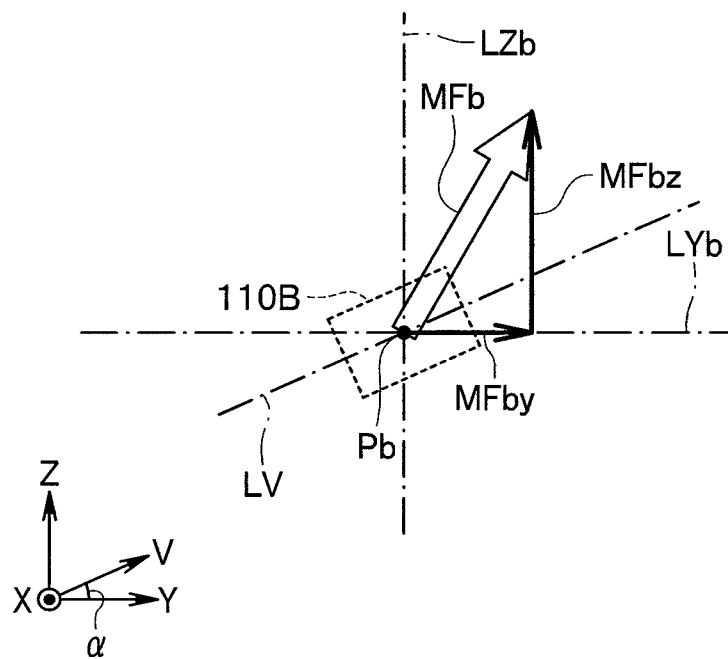
FIG. 13 is an explanatory diagram for describing a target magnetic field for a second magnetoresistive element of the second embodiment of the present invention to detect.

FIG. 13 is an explanatory diagram for describing a target magnetic field MF for the second MR element 110B to detect. In FIG. 13, the position where the second MR element 110B detects the target magnetic field MF is denoted by the symbol Pb. In the present embodiment, the direction and strength of the target magnetic field MF at the position Pb coincide with those of the target magnetic field MF at the reference position on the rotation axis C. The direction of the target magnetic field MF at the position Pb rotates about the position Pb. The target magnetic field MF at the position Pb will hereinafter be denoted by the symbol MFb.

In FIG. 13, an imaginary straight line that passes the position Pb and is parallel to the Y direction will be denoted by the symbol LYb. An imaginary straight line that passes the position Pb and is parallel to the Z direction will be denoted by the symbol LZb. An imaginary straight line that passes the position Pb and is parallel to the V direction will be denoted by the symbol LV.

In the magnetic sensor device 101, the directions of the magnetization of the magnetization pinned layers 52 in the MR elements 115 to 118 and the shape anisotropy of the free layers 54 in the MR elements 115 to 118 are set so that the strength of the component of the target magnetic field MFb in the direction parallel to the V direction can be detected. The X and V directions are shown in FIG. 11. For the sake of convenience, in FIG. 11, the V direction and the U direction are indicated by the same arrow. As shown in FIG. 11, in the present embodiment, the directions of the magnetization of the magnetization pinned layers 52 in the MR elements 115 and 117 are the V direction. The directions of the magnetization of the magnetization pinned layers 52 in the MR elements 116 and 118 are the −V direction. The free layer 54 has shape anisotropy such that the direction of the easy axis of magnetization is parallel to the X direction.

As shown in FIG. 13, the target magnetic field MFb can be regarded as a composite magnetic field of a magnetic field MFby in a direction parallel to the Y direction and a magnetic field MFbz in a direction parallel to the Z direction. The MR elements 115 to 118 each detect a composite magnetic field of a component of the magnetic field MFby in a direction parallel to the V direction and a component of the magnetic field MFbz in the direction parallel to the V direction. A component in the direction parallel to the V direction will hereinafter be referred to as a V component. The composite magnetic field of the V component of the magnetic field MFby and the V component of the magnetic field MFbz will be referred to as a second composite magnetic field. The differential detector 23 outputs a signal having a correspondence with the strength of the second composite magnetic field as the detection signal S2.

The strength of the second composite magnetic field is equal to the sum of the strength of the V component of the magnetic field MFby and the strength of the V component of the magnetic field MFbz. Both the strength of the target magnetic field MFb and the strength of the target magnetic field MFa are the same as that of the target magnetic field MF at the reference position. The strength of the magnetic field MFby is thus equal to that of the magnetic field MFay, and the strength of the magnetic field MFbz is equal to that of the magnetic field MFaz. Like the strength of the magnetic field MFay, the strength of the magnetic field MFby will therefore be denoted by the symbol By. Like the strength of the magnetic field MFaz, the strength of the magnetic field MFbz will be denoted by the symbol Bz. The ratio of a change in the detection signal S2 to a change in the strength of the second composite magnetic field will be denoted by the symbol Sb. The detection signal S2 is expressed by the following Eq. (2):

$$S2 = Sb*(By*\cos\alpha + Bz*\sin\alpha) \quad (2)$$

The strength of the V component is expressed in positive values when the direction of the V component is the V direction, and in negative values when the direction of the V component is the −V direction. The positive or negative sign of the strength of the V component of the magnetic field MFby coincides with that of the strength By of the magnetic field MFby. The positive or negative sign of the strength of the V component of the magnetic field MFbz also coincides with that of the strength Bz of the magnetic field MFbz. In Eq. (2), the strength of the V component of the magnetic field MFby is therefore expressed as "By*cos α", and the strength of the V component of the magnetic field MFbz is expressed as "Bz*sin α".

In the present embodiment, the detection value generation circuit 24 generates the detection value Vs on the basis of the detection signals S1 and S2. The detection value generation circuit 24 may determine the angle that the direction of the target magnetic field MF at the reference position forms with respect to the Z direction as the detection value Vs. This angle is expressed in positive values when the direction of the target magnetic field MF tilts from the Z direction toward the Y direction, and in negative values when the direction of the target magnetic field MF tilts from the Z direction toward the −Y direction. In such a case, the detection value generation circuit 24 initially calculates values Bys and Bzs on the basis of the detection signals S1 and S2. The value Bys indicates the strength of the component of the target magnetic field MF in the direction parallel to the Y direction at the reference position. The value Bzs indicates the strength of the component of the target magnetic field MF in the direction parallel to the Z direction at the reference position.

The strength of the component of the target magnetic field MF in the Y direction at the reference position is equal to the strength By of the magnetic field MFay or MFby. Suppose that the ratio Sa of a change in the detection signal S1 to a change in the strength of the first composite magnetic field and the ratio Sb of a change in the detection signal S2 to a change in the strength of the second composite magnetic field are equal to each other. By replacing both Sa in Eq. (1) and Sb in Eq. (2) with Sc, Eqs. (1) and (2) yield the strength By expressed by the following Eq. (3):

$$By = (S2 + S1)/(2Sc*\cos\alpha) \quad (3)$$

For example, the detection value generation circuit 24 calculates the value Bys by using the right-hand side of Eq. (3). Sc is determined in advance.

The strength of the component of the target magnetic field MF in the Z direction at the reference position is equal to the strength Bz of the magnetic field MFaz or MFbz. Like Eq. (3), by replacing Sa in Eq. (1) and Sb in Eq. (2) with Sc, Eqs. (1) and (2) yield the strength Bz expressed by the following Eq. (4):

$$Bz = (S2 - S1)/(2Sc*\sin\alpha) \quad (4)$$

For example, the detection value generation circuit 24 calculates the value Bzs by using the right-hand side of Eq. (4).

The detection value generation circuit 24 then determines the angle that the direction of the target magnetic field MF forms with respect to the Z direction as the detection value Vs by using the values Bys and Bzs. Specifically, for example, the detection value generation circuit 24 generates the detection value Vs by the following Eq. (5):

$$Vs = 90° - \text{atan}(Bzs/Bys)$$
$$= 90° - \theta s \qquad (5)$$

Note that "atan" represents arctangent.

For θs ranging from 0° to less than 360°, Eq. (5) yields two solutions of θs that are 180° different in value. Which of the two solutions of θs in Eq. (5) is the true value of θs can be determined in accordance with the combination of the signs of Bys and Bzs. The detection value generation circuit 24 determines θs within the range of 0° to less than 360° in accordance with Eq. (5) and the determination on the combination of the signs of Bys and Byz.

Next, the configuration and shape of the coil 130 will be described in more detail. The upper coil portions 130U of the coil 130 include coil elements 131U, 132U, 133U, and 134U. A coil element refers to a part of the conductor constituting the coil 130. In FIG. 10, both ends of each of the coil elements 131U to 134U are shown by dotted lines. The coil element 131U is located to overlap the MR elements 111 and 115 when viewed in the Z direction. The coil element 132U is located to overlap the MR elements 112 and 116 when viewed in the Z direction. The coil element 133U is located to overlap the MR elements 113 and 117 when viewed in the Z direction. The coil element 134U is located to overlap the MR elements 114 and 118 when viewed in the Z direction.

FIG. 9 shows the coil element 131U. The coil element 131U includes two conductor portions 131U1 and 131U2 extending continuously when viewed in one direction, two conductor portions 131U4 and 131U5 extending continuously when viewed in the one direction, and a conductor portion 131U3. In FIG. 9, the borders of the conductor portions 131U1 to 131U5 and both ends of the coil element 131U are shown by dotted lines. The conductor portions 131U1 to 131U5 are arranged in this order in a direction from the end of the coil element 131U in the Y direction to the end of the coil element 131U in the −Y direction.

At least a part of each of the conductor portions 131U1 and 131U2 is located on the inclined portion 165a1. In the example shown in FIG. 9, most of the conductor portion 131U1 is located on the inclined portion 165a1. The entire conductor portion 131U2 is located on the inclined portion 165a1. At least a part of each of the conductor portions 131U4 and 131U5 is located on the inclined portion 165a2. In the example shown in FIG. 9, the entire conductor portion 131U4 is located on the inclined portion 165a2. Most of the conductor portion 131U5 is located on the inclined portion 165a2.

The conductor portions 131U1 and 131U2 extend in a linear direction as a whole. Specifically, the conductor portions 131U1 and 131U2 extend along a direction parallel to the inclined portion 165a1. A dimension in a direction parallel to the X direction will hereinafter be referred to as a width. A dimension in a direction orthogonal to the bottom surface 165b of the support member 165, i.e., in a direction parallel to the Z direction will be referred to as a thickness. While the coil element 131U has a constant width, the thickness of the coil element 131U changes from the conductor portion 131U1 to the conductor portion 131U2. In particular, in the present embodiment, the thickness of the coil element 131U decreases from the conductor portion 131U1 to the conductor portion 131U2. The cross-sectional area of the coil element 131U perpendicular to the direction in which the current flows thus decreases from the conductor portion 131U1 to the conductor position 131U2. In the following description, when simply referred to as "the cross-sectional area of the coil element 131U", this phrase indicates the area of the cross section of the coil element 131U perpendicular to the direction in which the current flows.

An average thickness of the coil element 131U in the conductor portion 131U2 is smaller than that of the coil element 131U in the conductor portion 131U1. An average cross-sectional area of the coil element 131U in the conductor portion 131U2 is therefore smaller than that of the coil element 131U in the conductor portion 131U1.

The conductor portions 131U4 and 131U5 extend in a linear direction as a whole. Specifically, the conductor portions 131U4 and 131U5 extend along a direction parallel to the inclined portion 165a2. While the coil element 131U has a constant width, the thickness of the coil element 131U changes from the conductor portion 131U4 to the conductor portion 131U5. In particular, in the present embodiment, the thickness of the coil element 131U decreases from the conductor portion 131U4 to the conductor portion 131U5. The cross-sectional area of the coil element 131U perpendicular to the direction in which the current flows thus decreases from the conductor portion 131U4 to the conductor position 131U5. An average thickness of the coil element 131U in the conductor portion 131U4 is smaller than that of the coil element 131U in the conductor portion 131U5. An average cross-sectional area of the coil element 131U in the conductor portion 131U4 is therefore smaller than that of the coil element 131U in the conductor portion 131U5.

Like the first embodiment, one of the two conductor portions extending continuously when viewed in one direction, where the average cross-sectional area of the coil element 131U is smaller, will be referred to as a first conductor portion. The other conductor portion where the average cross-sectional area of the coil element 131U is greater will be referred to as a second conductor portion. The first conductor portion is located at a position where a first partial magnetic field occurring from the first conductor portion due to the current flowing through the coil 130 is applied to a magnetic detection element. The second conductor portion is located at a position where a second partial magnetic field occurring from the second conductor portion due to the current flowing through the coil 130 is not applied to the magnetic detection element, or a position where the second partial magnetic field applied to the magnetic detection element has strength lower than that of the first partial magnetic field applied to the magnetic detection element. In particular, in the present embodiment, the conductor portions 131U2, and 131U4 correspond to first conductor portions. The conductor portions 131U1, and 131U5 correspond to second conductor portions.

The first partial magnetic field occurring from the conductor portion 131U2 is mainly applied to the MR element 111. The second partial magnetic field occurring from the conductor portion 131U1 and applied to the MR element 111 has strength lower than that of the first partial magnetic field occurring from the conductor portion 131U2 and applied to the MR element 111. The second partial magnetic field occurring from the conductor portion 131U1 does not need to be applied to the MR element 111.

The first partial magnetic field occurring from the conductor portion 131U4 is mainly applied to the MR element 115. The second partial magnetic field occurring from the conductor portion 131U5 and applied to the MR element 115 has strength lower than that of the first partial magnetic field occurring from the conductor portion 131U4 and applied to the MR element 115. The second partial magnetic field occurring from the conductor portion 131U5 does not need to be applied to the MR element 115.

The conductor portion 131U3 connects the conductor portions 131U2 and 131U4. While the coil element 131U has a constant width, the average thickness of the coil element 131U in the conductor portion 131U3 is smaller than that of the coil element 131U in the conductor portions 131U2 and 131U4. The average cross-sectional area of the coil element 131U in the conductor portion 131U3 is thus smaller than that of the coil element 131U in the conductor portions 131U2 and 131U4.

The coil elements 132U to 134U have the same configuration as that of the coil element 131U. The foregoing series of descriptions of the conductor portions of the coil element 131U therefore applies to the coil elements 132U to 134U as well. A description of the conductor portions of the coil element 132U is given by replacing "131" in the foregoing description with "132", and replacing the MR elements 111 and 115 with the MR elements 112 and 116, respectively. Similarly, a description of the conductor portions of the coil element 133U is given by replacing "131" in the foregoing description with "133", and replacing the MR elements 111 and 115 with the MR elements 113 and 117, respectively. Similarly, a description of the conductor portions of the coil element 134U is given by replacing "131" in the foregoing description with "134", and replacing the MR elements 111 and 115 with the MR elements 114 and 118, respectively.

The configuration, operation and effects of the present embodiment are otherwise the same as those of the first embodiment.

The present invention is not limited to the foregoing embodiments, and various modification examples may be made thereto. The shapes of the first and second conductor portions and the layout of the first and second conductor portions and the magnetic detection elements are not limited to the examples described in the foregoing embodiments, and may be freely set as long as the requirements of the claims are satisfied. For example, in the first embodiment, the MR elements 50 are located to overlap the parts of the upper coil portion 11U where the upper coil portion 11U has the smallest width and the parts of the lower coil portion 11L where the lower coil portion 11L has the smallest width when viewed in the Z direction. However, the MR elements 50 may be located not to overlap the parts where the upper coil portion 11U has the smallest width or the parts where the lower coil portion 11L has the smallest width.

In the first embodiment, the coil 11 may include either one of the upper and lower coil portions 11U and 11L. Alternatively, the coil 11 may be wound around the detection circuit 12 by two turns or more.

In the first embodiment, the upper and lower coil portions 11U and 11L each may change in thickness. In such a case, each of the upper and lower coil portions 11U and 11L may be constant or change in width. Similarly, in the second embodiment, the coil elements 131U to 134U each may change in width. In such a case, each of the coil elements 131U to 134U may be constant or change in thickness.

In the first embodiment, the bus bar 2 may include first and second conductor portions. In such a case, the main body 10 of the magnetic sensor device 1 is located above or below the part of the bus bar 2 where the first and second conductor portions are formed. Alternatively, a conductor including first and second conductor portions may be connected to the bus bar 2. In such a case, the main body 10 of the magnetic sensor device 1 is located above or below the conductor connected to the bus bar 2.

Obviously, various modification examples and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor device comprising:
   a magnetic detection element that detects an external magnetic field; and
   a conductor through which a current flows, wherein
   the conductor includes a first conductor portion and a second conductor portion that extend continuously when viewed in one direction,
   a cross-sectional area of the conductor perpendicular to a direction in which the current flows changes from the first conductor portion to the second conductor portion,
   an average cross-sectional area of the conductor in the first conductor portion is smaller than that of the conductor in the second conductor portion,
   the first conductor portion is located at a position where a first partial magnetic field occurring from the first conductor portion due to the current is applied to the magnetic detection element, and
   the second conductor portion is located at a position where a second partial magnetic field occurring from the second conductor portion due to the current is not applied to the magnetic detection element, or a position where the second partial magnetic field applied to the magnetic detection element has strength lower than that of the first partial magnetic field applied to the magnetic detection element.

2. The magnetic sensor device according to claim 1, wherein:
   the conductor further includes a third conductor portion located on a side opposite to the second conductor portion with respect to the first conductor portion;
   the first to third conductor portions extend continuously when viewed in the one direction;
   the cross-sectional area of the conductor perpendicular to the direction in which the current flows changes from the first conductor portion to the third conductor portion;
   the average cross-sectional area of the conductor in the third conductor portion is greater than that of the conductor in the first conductor portion; and
   the third conductor portion is located at a position where a third partial magnetic field occurring from the third conductor portion due to the current is not applied to the magnetic detection element, or a position where the third partial magnetic field applied to the magnetic detection element has strength lower than that of the first partial magnetic field applied to the magnetic detection element.

3. The magnetic sensor device according to claim 1, wherein the magnetic sensor device is used as a current sensor that detects a current to be detected.

4. The magnetic sensor device according to claim 3, wherein:
   the conductor constitutes a coil for generating a second magnetic field that cancels out a first magnetic field generated by the current to be detected; and the magnetic detection element detects a composite magnetic field of the first magnetic field and the second magnetic field.

5. The magnetic sensor device according to claim 3, wherein the magnetic detection element is a magnetoresistive element.

6. The magnetic sensor device according to claim 1, wherein:
the magnetic detection element is a magnetoresistive element;
the magnetoresistive element includes a magnetization pinned layer having a first magnetization whose direction is fixed, and a free layer having a second magnetization whose direction is variable depending on the external magnetic field; and
the conductor constitutes a coil for generating a magnetic field that sets the direction of the second magnetization of the free layer to a predetermined direction.

7. The magnetic sensor device according to claim 6, further comprising a support member that supports the magnetic detection element, wherein:
the support member includes a top surface opposed to the magnetic detection element and a bottom surface located opposite to the top surface;
the top surface of the support member includes an inclined portion inclined relative to the bottom surface; and
the magnetic detection element, at least a part of the first conductor portion, and at least a part of the second conductor portion are located on the inclined portion.

8. The magnetic sensor device according to claim 7, wherein:
a thickness of the conductor in a direction perpendicular to the bottom surface of the support member changes from the first conductor portion to the second conductor portion; and
an average thickness of the conductor in the first conductor portion is smaller than that of the conductor in the second conductor portion.

* * * * *